(12) United States Patent
Yeh et al.

(10) Patent No.: US 11,670,601 B2
(45) Date of Patent: Jun. 6, 2023

(54) STACKING VIA STRUCTURES FOR STRESS REDUCTION

(71) Applicant: Taiwan Semiconductor Manufacturing Co., Ltd., Hsinchu (TW)

(72) Inventors: Shu-Shen Yeh, Taoyuan (TW); Che-Chia Yang, Taipei (TW); Chin-Hua Wang, New Taipei (TW); Po-Yao Lin, Zhudong Township (TW); Shin-Puu Jeng, Hsinchu (TW); Chia-Hsiang Lin, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/126,957

(22) Filed: Dec. 18, 2020

(65) Prior Publication Data

US 2022/0020700 A1   Jan. 20, 2022

Related U.S. Application Data

(60) Provisional application No. 63/053,346, filed on Jul. 17, 2020.

(51) Int. Cl.
  *H01L 23/00* (2006.01)
  *H01L 23/31* (2006.01)
  (Continued)

(52) U.S. Cl.
  CPC ........ *H01L 23/562* (2013.01); *H01L 21/4853* (2013.01); *H01L 21/4857* (2013.01);
  (Continued)

(58) Field of Classification Search
  CPC ............... H01L 23/562; H01L 21/4853; H01L 21/4857; H01L 21/563; H01L 23/3185;
  (Continued)

(56) References Cited

U.S. PATENT DOCUMENTS

8,361,842 B2   1/2013 Yu et al.
8,680,647 B2   3/2014 Yu et al.
(Continued)

FOREIGN PATENT DOCUMENTS

CN   101213890 A   *   7/2008   ............. H01L 23/15
EP   3038150 A1   6/2016
(Continued)

OTHER PUBLICATIONS

Wikipedia, "Oval," Jun. 18, 2020 (Year: 2020).*

*Primary Examiner* — Selim U Ahmed
*Assistant Examiner* — Evan G Clinton
(74) *Attorney, Agent, or Firm* — Slater Matsil, LLP

(57) ABSTRACT

A method includes forming a first dielectric layer, forming a first redistribution line comprising a first via extending into the first dielectric layer, and a first trace over the first dielectric layer, forming a second dielectric layer covering the first redistribution line, and patterning the second dielectric layer to form a via opening. The first redistribution line is revealed through the via opening. The method further includes forming a second via in the second dielectric layer, and a conductive pad over and contacting the second via, and forming a conductive bump over the conductive pad. The conductive pad is larger than the conductive bump, with a first center of conductive pad being offsetting from a second center of the conductive bump. The second via is further offset from the second center of the conductive bump.

20 Claims, 19 Drawing Sheets

(51) Int. Cl.
  *H01L 21/48* (2006.01)
  *H01L 21/56* (2006.01)
  *H01L 23/538* (2006.01)
  *H01L 23/48* (2006.01)
  *H01L 25/065* (2023.01)

(52) U.S. Cl.
  CPC ........ *H01L 21/563* (2013.01); *H01L 23/3107* (2013.01); *H01L 23/3185* (2013.01); *H01L 23/481* (2013.01); *H01L 23/5383* (2013.01); *H01L 23/5386* (2013.01); *H01L 23/5389* (2013.01); *H01L 24/13* (2013.01); *H01L 24/16* (2013.01); *H01L 25/0657* (2013.01); *H01L 2224/12105* (2013.01); *H01L 2224/16227* (2013.01); *H01L 2924/18161* (2013.01); *H01L 2924/351* (2013.01); *H01L 2924/35121* (2013.01)

(58) Field of Classification Search
  CPC . H01L 23/5383; H01L 23/5386; H01L 24/16; H01L 2224/16227; H01L 2924/18161; H01L 2924/35121; H01L 21/6835; H01L 24/81; H01L 25/0652; H01L 24/13; H01L 24/32; H01L 24/73; H01L 24/83; H01L 24/91; H01L 2221/68345; H01L 2221/68359; H01L 2224/13101; H01L 2224/73204; H01L 2224/81191; H01L 2224/81192; H01L 2224/8385; H01L 2224/92125; H01L 2924/15311; H01L 2924/181; H01L 23/49822; H01L 23/49816; H01L 21/76895; H01L 23/4983
  See application file for complete search history.

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 9,640,498 | B1 | 5/2017 | Huang et al. |
| 9,741,690 | B1 | 8/2017 | Hsieh et al. |
| 9,773,753 | B1 | 9/2017 | Lin et al. |
| 10,062,648 | B2 | 8/2018 | Hsieh et al. |
| 10,157,871 | B1 | 12/2018 | Yu et al. |
| 10,204,852 | B2 | 2/2019 | Hsu et al. |
| 10,566,288 | B2 | 2/2020 | Kao et al. |
| 10,629,560 | B2 | 4/2020 | Chen et al. |
| 11,101,209 | B2 | 8/2021 | Liu et al. |
| 11,508,656 | B2 | 11/2022 | Pan et al. |
| 2005/0046041 | A1 | 3/2005 | Tsai et al. |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0021600 | A1 | 1/2014 | Daubenspeck et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2016/0163578 | A1 | 6/2016 | Yu et al. |
| 2017/0250138 | A1* | 8/2017 | Hsieh .................. H01L 21/4857 |
| 2018/0233474 | A1* | 8/2018 | Yu .......................... H01L 24/05 |
| 2019/0074195 | A1 | 3/2019 | Hu |
| 2019/0189552 | A1 | 6/2019 | Kelly et al. |
| 2019/0326241 | A1* | 10/2019 | Chen .................. H01L 23/53238 |
| 2020/0043842 | A1 | 2/2020 | Kim et al. |
| 2020/0091097 | A1 | 3/2020 | Hung et al. |
| 2021/0134750 | A1* | 5/2021 | Manack .................. H01L 24/13 |

FOREIGN PATENT DOCUMENTS

| | | |
|---|---|---|
| TW | 201618626 A | 5/2016 |
| TW | 201715681 A | 5/2017 |
| TW | 201729364 A | 8/2017 |
| TW | 201916304 A | 4/2019 |
| TW | 202002110 A | 1/2020 |

* cited by examiner

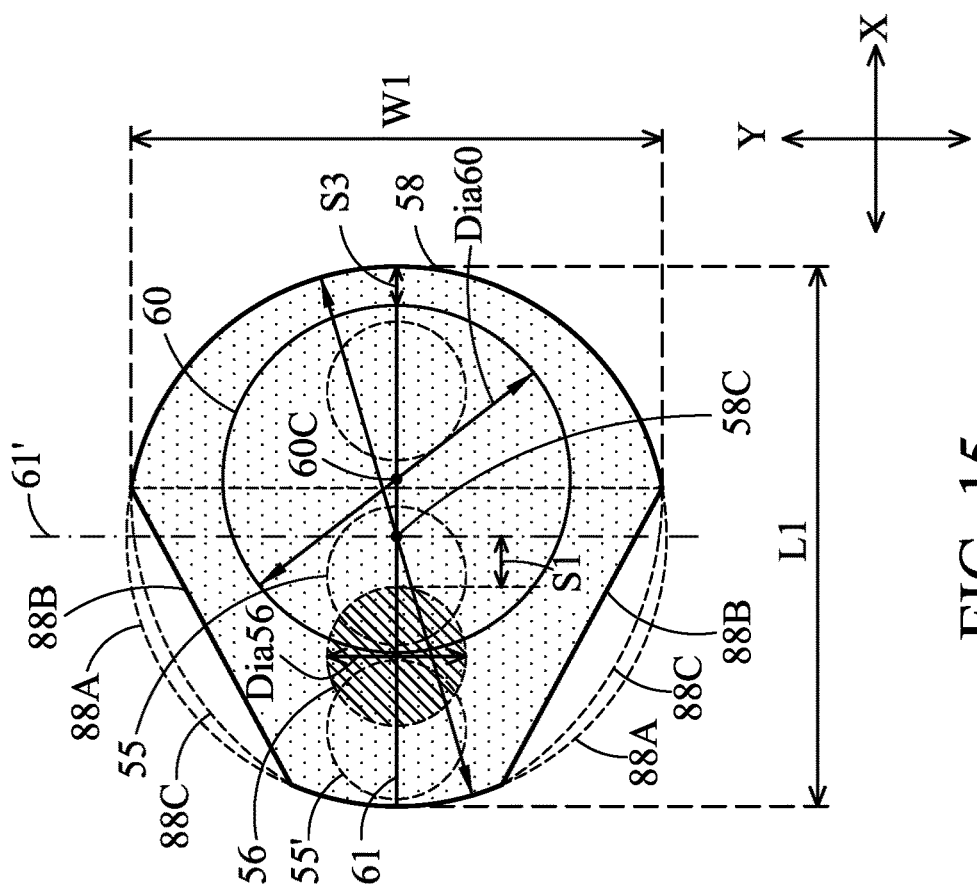
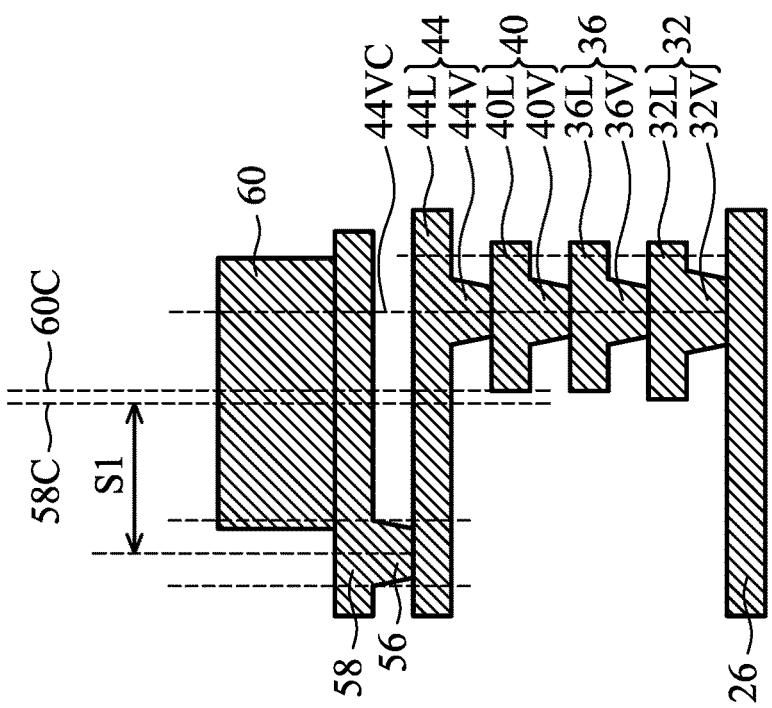
FIG. 15
FIG. 14

STACKING VIA STRUCTURES FOR STRESS REDUCTION

PRIORITY CLAIM AND CROSS-REFERENCE

This application claims the benefit of the U.S. Provisional Application No. 63/053,346, filed Jul. 17, 2020, and entitled "A Novel Stacking Via Structure in Fan-out Package," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

A typical bonding structure may include an Under-Bump-Metallurgy (UBM), which is a metal pad, and a metal pillar on the UBM. A solder region may be used for bonding the metal pillar to another electrical connector of another package component.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 illustrates the cross-sectional view of an eccentric bonding structure in accordance with some embodiments.

FIG. 15 illustrates a top view of an eccentric bonding structure in accordance with some embodiments.

DETAILED DESCRIPTION

Figure 1:
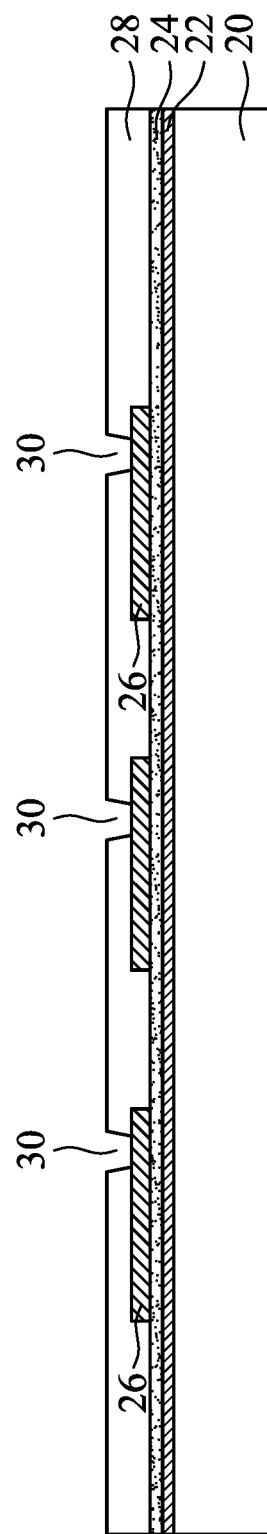
FIGS. 1 through 12 illustrate the cross-sectional views of intermediate stages in the formation of an interconnect component including eccentric bonding structures in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including eccentric bonding structures and the method of forming the same are provided. In accordance with some embodiments of the present disclosure, a conductive bump (which may be a metal pillar) is formed, and a conductive pad is formed underneath the conductive bump, with the conductive pad being larger than the conductive bump. The conductive pad is elongated, and may have one side narrower than the other side. A first via is underlying and joined to the conductive pad. The first via is vertically offset from the center of the overlying conductive bump. A redistribution line underlying and joined to the first via may have a narrow center portion. A plurality of second vias, which are underlying and electrically connected to the first via, are also offset from the first via. The offsets and the specific shapes of the conductive pad and the redistribution line may prevent the conductive bump, conductive pad, and the vias that have high Coefficient of Thermal Extension (CTE) values from being vertically aligned, and hence may reduce the stress. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 12 illustrate the cross-sectional views of intermediate stages in the formation of an interconnect component including eccentric bonding structures in accordance with some embodiments of the present disclosure. The corresponding processes are also reflected schematically in the process flow shown in FIG. 22. It is appreciated that although the interconnect component including the eccentric bonding structures are formed starting from a carrier, it may also be formed starting from other components such as a fan-out interconnect structure of device dies, a part of a device die or an interposer, etc.

FIG. 1 illustrates carrier 20 and release film 22 formed on carrier 20. Carrier 20 may be a glass carrier, a silicon wafer, an organic carrier, or the like. Carrier 20 may have a round top-view shape in accordance with some embodiments. Release film 22 may be formed of a polymer-based material (such as a Light-To-Heat-Conversion (LTHC) material), which is capable of being decomposed under radiation such as a laser beam, so that carrier 20 may be de-bonded from the overlying structures that will be formed in subsequent processes. In accordance with some embodiments of the present disclosure, release film 22 comprises an epoxy-based thermal-release material, which is coated onto carrier 20.

Figure 22:
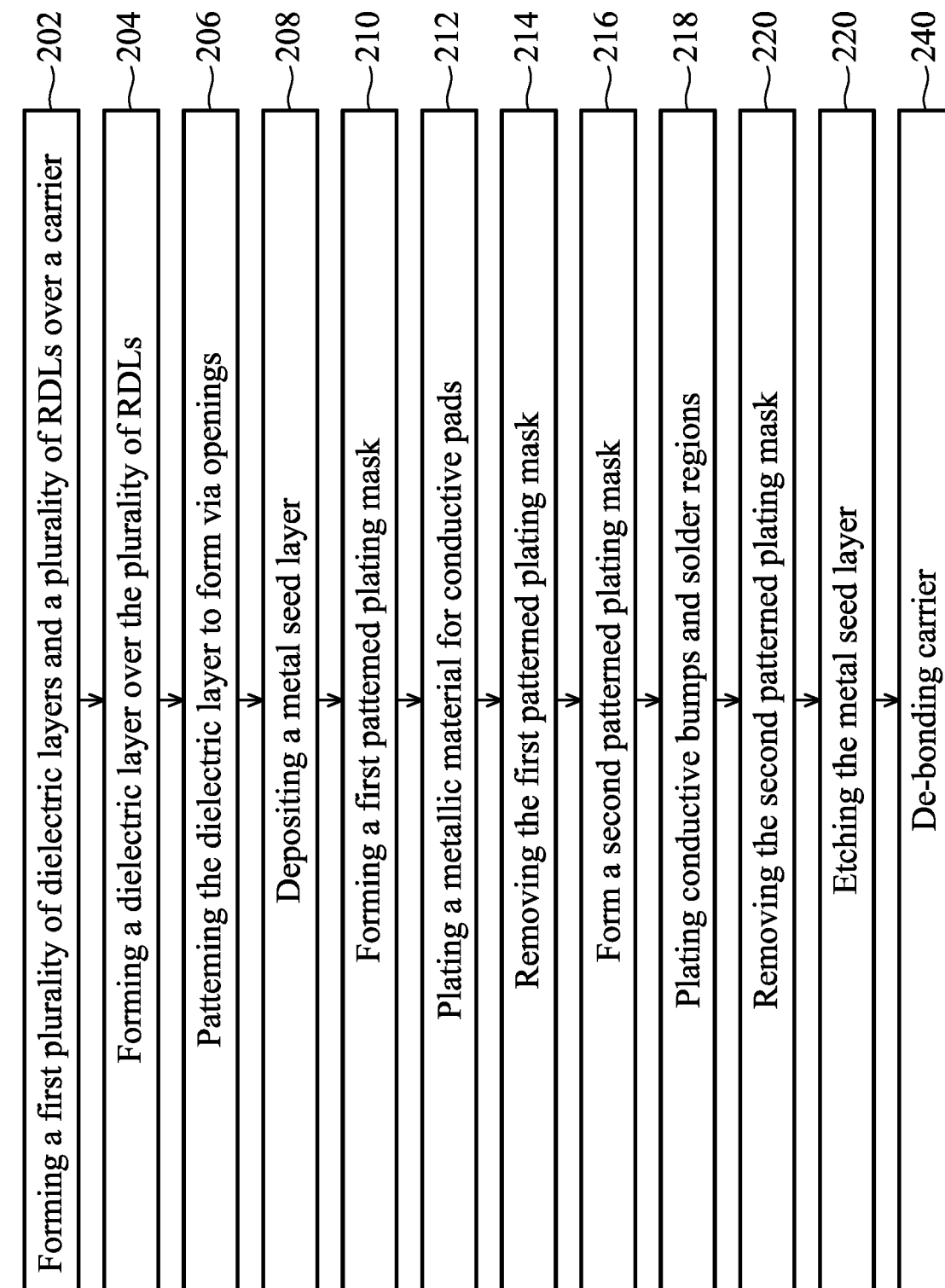
FIG. 22 illustrates a process flow for forming an interconnect component including eccentric bonding structures in accordance with some embodiments.

A plurality of dielectric layers and a plurality of RDLs are formed over the release film 22, as shown in FIGS. 1 through 4. The respective process is illustrated as process 202 in the process flow 200 as shown in FIG. 22. Referring to FIG. 1, dielectric layer 24 is first formed on release film 22. In accordance with some embodiments of the present disclosure, dielectric layer 24 is formed of a polymer, which may also be a photo-sensitive material such as polybenzoxazole (PBO), polyimide, benzocyclobutene (BCB), or the like, that may be easily patterned using a photo lithography process.

Redistribution Lines (RDLs) 26 are formed over dielectric layer 24 in accordance with some embodiments. The formation of RDLs 26 may include forming a seed layer (not shown) over dielectric layer 24, forming a patterned mask (not shown) such as a photo resist over the seed layer, and then performing a metal plating process on the exposed seed layer. The patterned mask and the portions of the seed layer covered by the patterned mask are then removed, leaving RDLs 26 as in FIG. 1. In accordance with some embodiments of the present disclosure, the seed layer includes a titanium layer and a copper layer over the titanium layer. The seed layer may be formed using, for example, Physical Vapor Deposition (PVD) or a like process. The plating may be performed using, for example, electro-less plating.

Further referring to FIG. 1, dielectric layer 28 is formed on RDLs 26. The bottom surface of dielectric layer 28 is in contact with the top surfaces of RDLs 26 and dielectric layer 24. In accordance with some embodiments of the present disclosure, dielectric layer 28 is formed of a polymer, which may be a photo-sensitive material such as PBO, polyimide, BCB, or the like. Alternatively, dielectric layer 28 may include a non-organic dielectric material such as silicon oxide, silicon nitride, silicon carbide, silicon oxynitride, or the like. Dielectric layer 28 is then patterned to form openings 30 therein. Hence, some portions of RDLs 26 are exposed through the openings 30 in dielectric layer 28.

Figure 2:
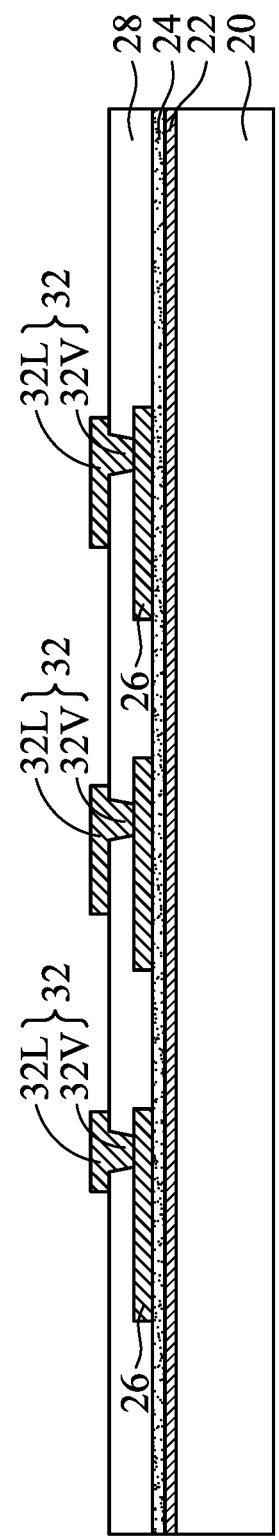

Next, referring to FIG. 2, RDLs 32 are formed to connect to RDLs 26. RDLs 32 include metal traces (metal lines) over dielectric layer 28. RDLs 32 also include vias extending into the openings 30 in dielectric layer 28. RDLs 32 may also be formed through a plating process, wherein each of RDLs 32 includes a seed layer (not shown) and a plated metallic material over the seed layer. In accordance with some embodiments, the formation of RDLs 32 may include depositing a blanket metal seed layer extending into the via openings, and forming and patterning a plating mask (such as photo resist), with opening formed directly over the via openings. A plating process is then performed to plate a metallic material, which fully fills the via openings 30, and has some portions higher than the top surface of dielectric layer 28. The plating mask is then removed, followed by an etching process to remove the exposed portions of the metal seed layer, which was previously covered by the plating mask. The remaining portions of the metal seed layer and the plated metallic material are RDLs 32.

The metal seed layer and the plated material may be formed of the same material or different materials. The metallic material in RDLs 32 may include a metal or a metal alloy including copper, aluminum, tungsten, or alloys thereof. RDLs 32 include RDL lines (also referred to as traces, trace portions) 32L and via portions (also referred to as vias) 32V, wherein trace portions 32L are over dielectric layer 28, and via portions 32V are in dielectric layer 28. Since trace portions 32L and via portions (also referred to as vias) 32V are formed in a same plating process, there is no distinguishable interface between vias 32V and the corresponding overlying trace portions 32L. Also, each of vias 32V may have a tapered profile, with the upper portions wider than the corresponding lower portions.

Figure 3:
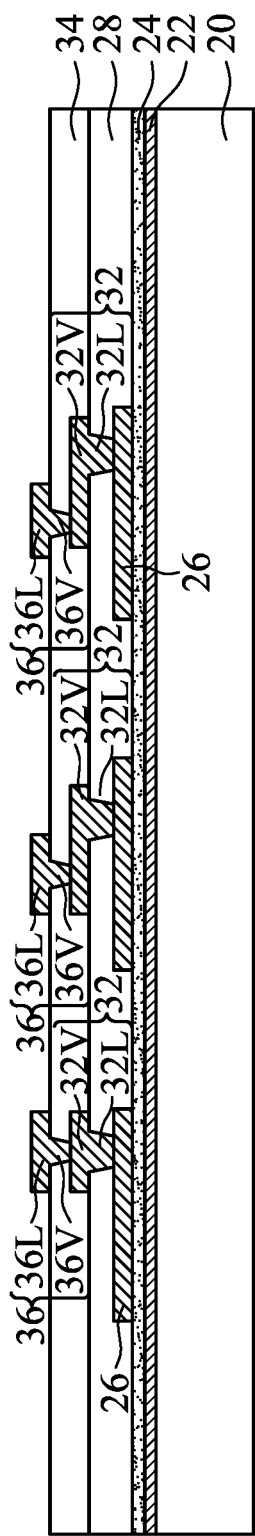

Referring to FIG. 3, dielectric layer 34 is formed over RDLs 32 and dielectric layer 28. Dielectric layer 34 may be formed using a polymer, which may be selected from the same group of candidate materials as those of dielectric layer 28. For example, dielectric layer 34 may be formed of PBO, polyimide, BCB, or the like. Alternatively, dielectric layer 34 may include a non-organic dielectric material such as silicon oxide, silicon nitride, silicon carbide, silicon oxynitride, or the like.

FIG. 3 further illustrates the formation of RDLs 36, which are electrically connected to RDLs 32. The formation of RDLs 36 may adopt the methods and materials similar to those for forming RDLs 32. RDLs 36 include the trace portions (RDL lines) 36L and via portions (vias) 36V, wherein trace portions 36L are over dielectric layer 34, and vias 36V extend into dielectric layer 34. Also, each of vias 36V may have a tapered profile, with the upper portions wider than the corresponding lower portions.

Figure 4:
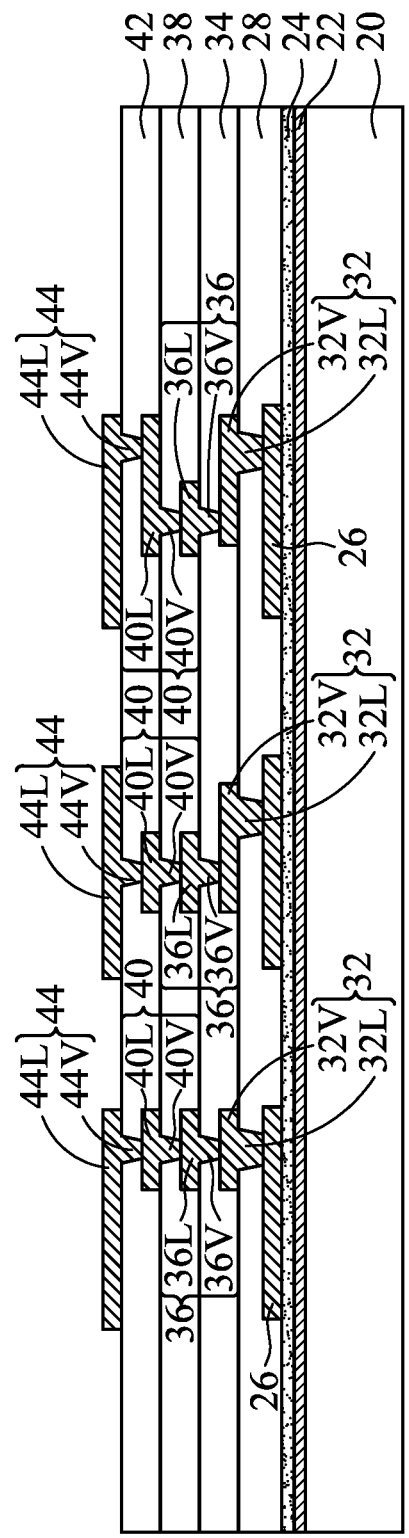

FIG. 4 illustrates the formation of dielectric layers 38 and 42 and RDLs 40 and 44. In accordance with some embodiments of the present disclosure, dielectric layers 38 and 42 are formed of materials selected from the same group of candidate materials for forming dielectric layers 34 and 28, and may include organic materials or inorganic materials, as aforementioned. It is appreciated that although in the illustrated example embodiments, four dielectric layers 28, 34, 38, and 42, and the respective RDLs 32, 36, 40, and 44 formed therein are discussed as an example, fewer or more dielectric layers and RDL layers may be adopted, depending on the routing requirement.

Figure 5:
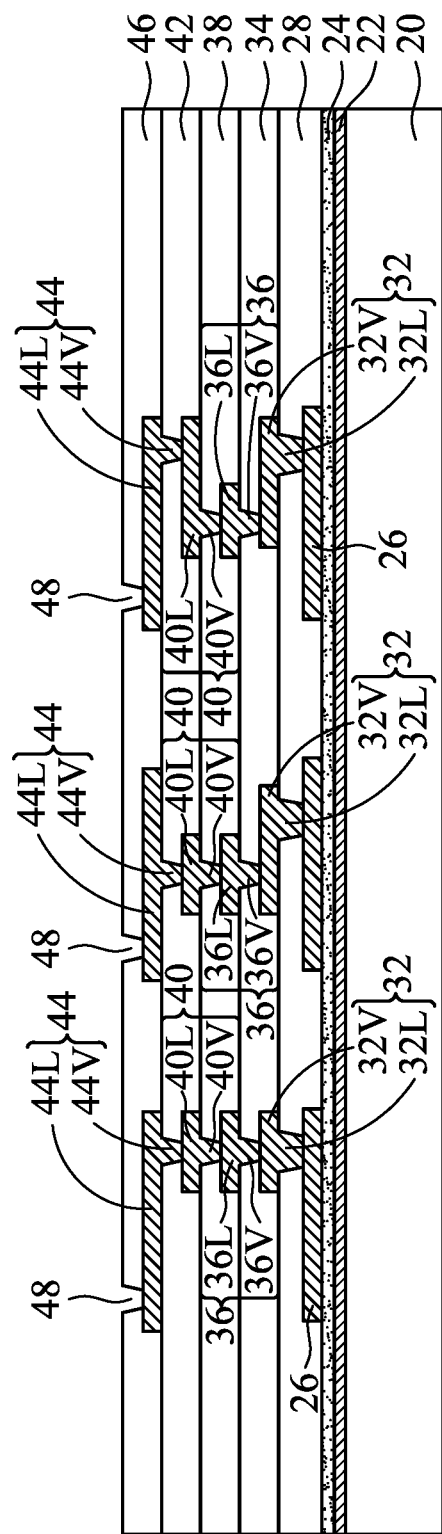

FIGS. 5 through 10 illustrate the formation of vias 56, conductive pads 58, and conductive bumps 60 (FIG. 10) in accordance with some embodiments. Referring to FIG. 5, dielectric layer 46 is formed. The respective process is illustrated as process 204 in the process flow 200 as shown in FIG. 22. In accordance with some embodiments, dielectric layer 46 is formed of a polymer, which may be a photo-sensitive material such as PBO, polyimide, BCB, or the like. Dielectric layer 46 is patterned to form via openings 48, so that the underlying pad portions of RDL lines 44L are exposed. The respective process is illustrated as process 206 in the process flow 200 as shown in FIG. 22. In accordance with some embodiments, via openings 48 are laterally offset from the respective underlying vias 40V. As shown in FIG. 5, some vias 44V may be offset to an opposite side with relative to the center line of the corresponding overlying RDL lines 44L than the corresponding openings 48.

Figure 6:
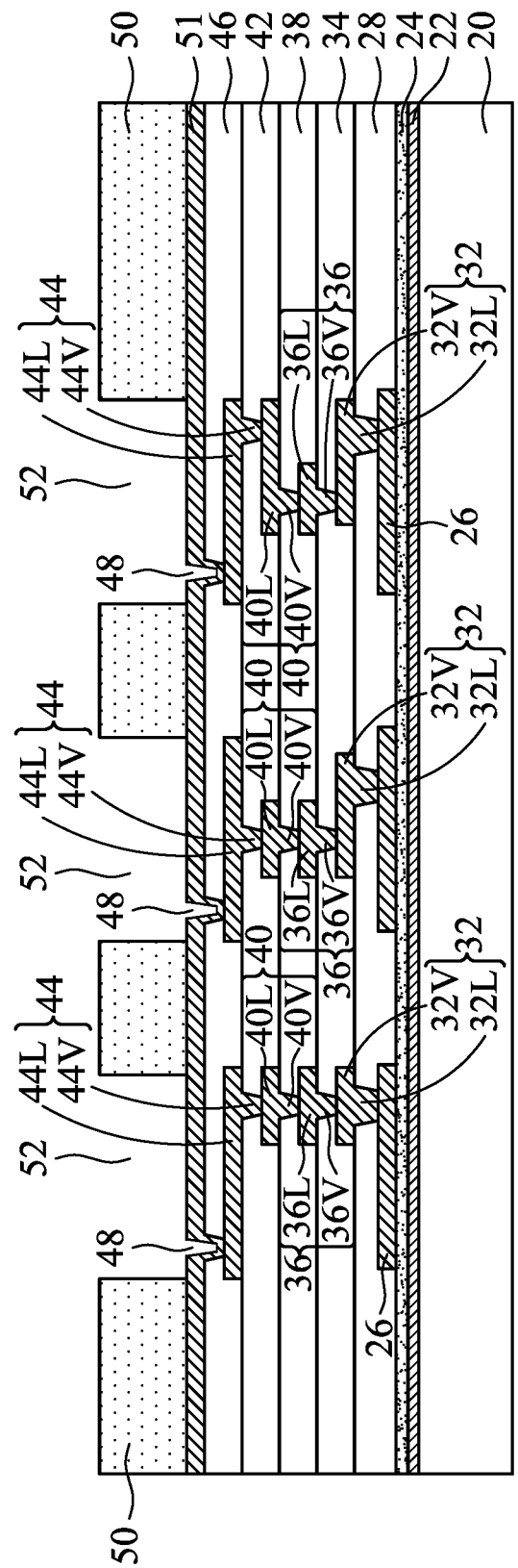

Referring to FIG. 6, metal seed layer 51 is deposited. The respective process is illustrated as process 208 in the process flow 200 as shown in FIG. 22. In accordance with some embodiments, metal seed layer 51 includes a titanium layer and a copper layer over the titanium layer. In accordance with alternative embodiments, metal seed layer 51 includes a single copper layer, which is in physical contact with dielectric layer 46. Plating mask 50 is then formed and patterned, with openings 52 being formed in plating mask 50. The respective process is illustrated as process 210 in the process flow 200 as shown in FIG. 22. Via openings 48 are under and joined with openings 52. The top-view shape of openings 52 may be irregular, for example, having the shape of conductive pad 58 as shown in FIG. 15.

Figure 7:
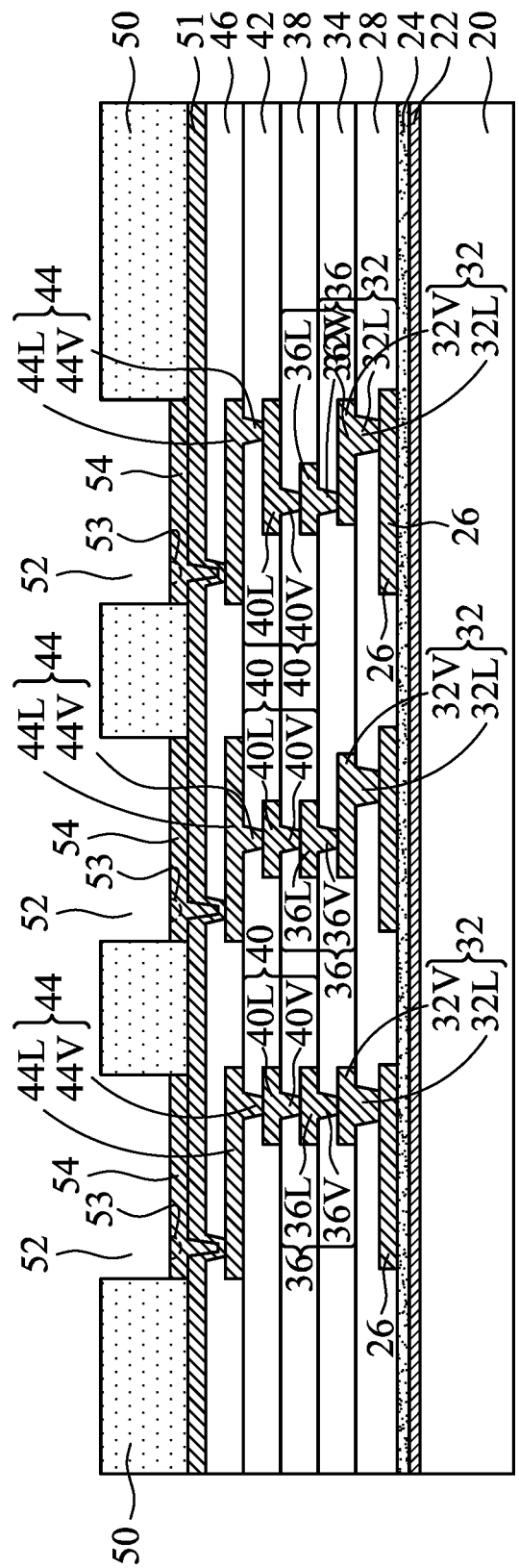

Referring to FIG. 7, metallic material 54 is deposited through a plating process. The respective process is illustrated as process 212 in the process flow 200 as shown in FIG. 22. The plating process may include electrochemical plating, electroless plating, or the like. In accordance with some embodiments, metallic material 54 comprises copper or a copper alloy. Process conditions may be adjusted, so that the top surface of the plated material 54 may be planar. In accordance with alternative embodiments, the portions of the top surfaces of metallic material 54 may have recesses, as illustrated by dashed lines 53, which recesses are formed due to the filling of via openings 48 (FIG. 7).

In subsequent processes, plating mask 50, which may be a photo resist, is removed, for example, through an ashing process. The respective process is illustrated as process 214 in the process flow 200 as shown in FIG. 22. The underlying portions of metal seed layer 51 are thus exposed.

Figure 8:
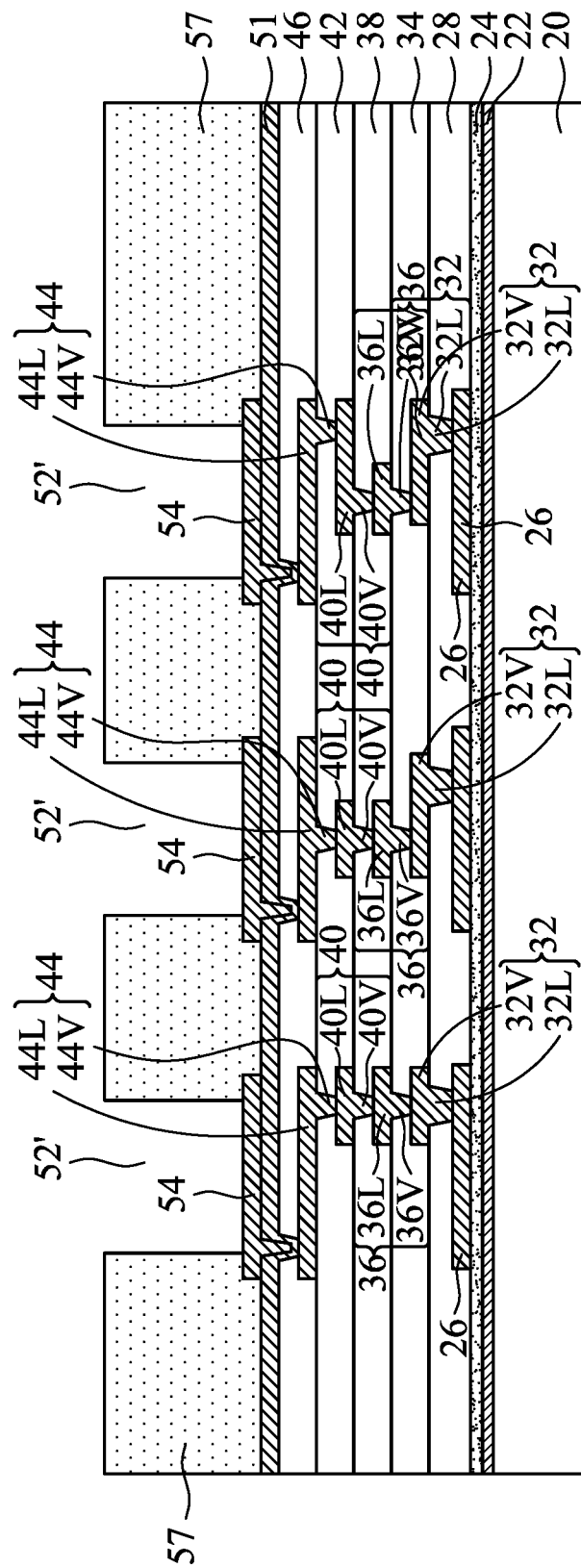
Figure 21:
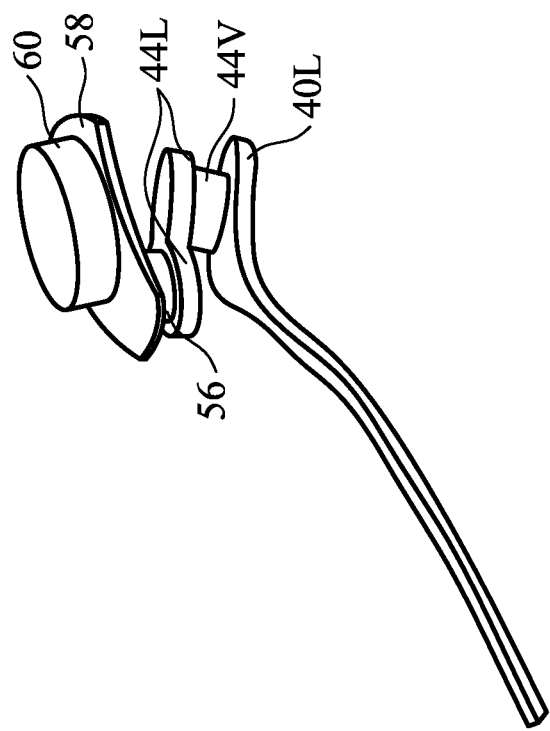
FIGS. 20 and 21 illustrate the structures that are simulated in accordance with some embodiments.

Referring to FIG. 8, without removing metal seed layer 51, plating mask 57 is formed on metal seed layer 51 and the plated material 54. Plating mask 57 has openings 52'. The respective process is illustrated as process 216 in the process flow 200 as shown in FIG. 22. Next, conductive bumps 60 are formed through a plating process, which may be an electrochemical plating process or an electroless plating process, for example. The respective process is illustrated as process 218 in the process flow 200 as shown in FIG. 22. The entireties of conductive bumps 60 may be formed of a homogeneous material such as copper or a copper alloy. Conductive bumps 60 and the underlying plated materials 54 may have distinguishable interfaces in between, or may be merged with each other (for example, when both formed of copper) without distinguishable interfaces in between. Conductive bumps 60 are also referred to as metal pillars or metal rods due to their shapes. For example, FIG. 21 illustrates an example conductive bump 60, which have a round top-view shape, while other shapes such as hexagonal shapes, octagonal shapes, or the like may also be adopted, depending on the top-view shapes of openings 52'.

Figure 9:
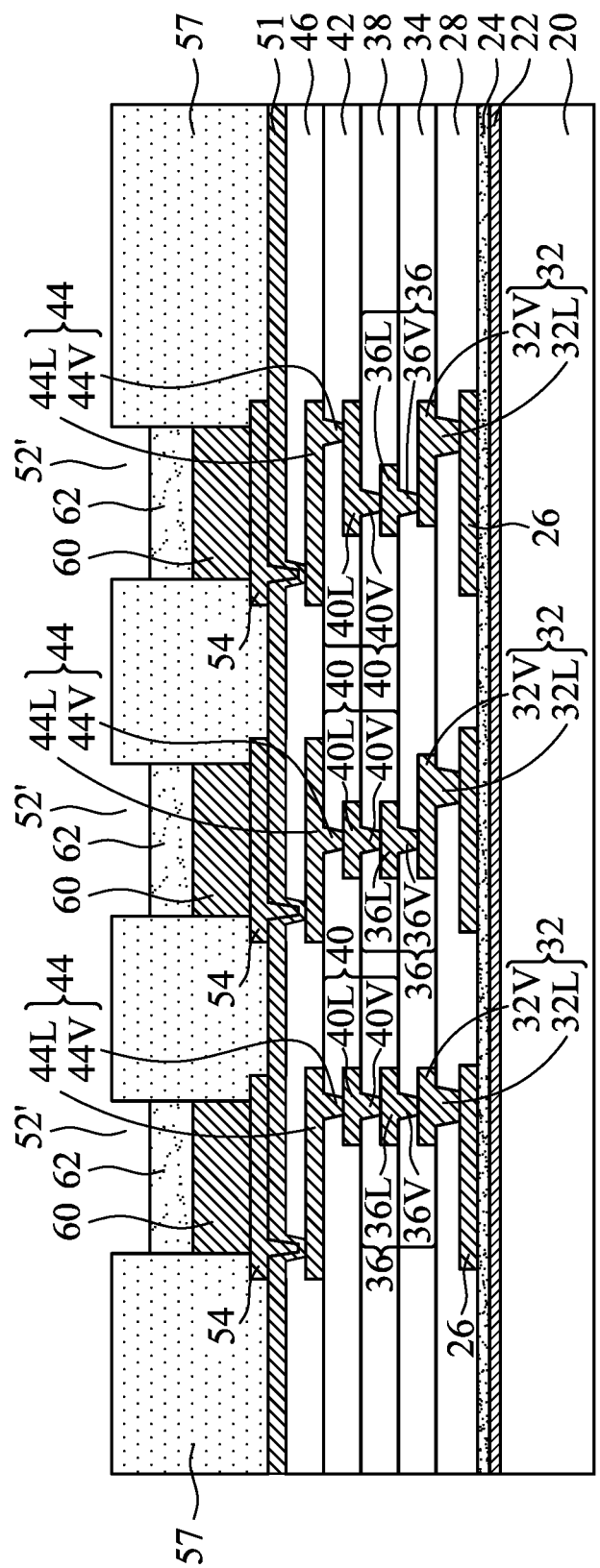

FIG. 9 further illustrates the deposition of solder regions 62 in accordance with some embodiments, which are also deposited through plating. Solder regions 62 may be formed of or comprise a lead-free solder such as AgSn, AgSnCu, SnPb, or the like. In accordance with alternative embodiments, solder regions 62 are not formed.

Figure 10:
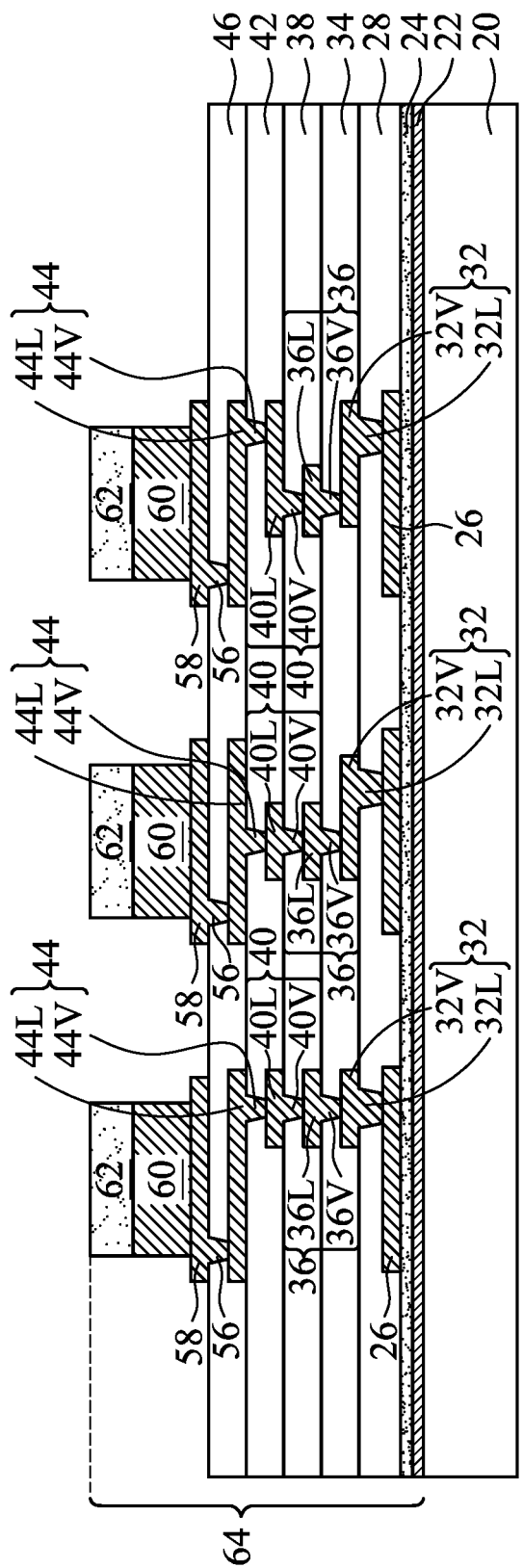

In a subsequent process, plating mask 57 is removed, for example, through ashing. The respective process is illustrated as process 220 in the process flow 200 as shown in FIG. 22. Next, an etching process, which may be a wet etching process or a dry etching process, is performed to remove the exposed portions of metal seed layer 51. The respective process is illustrated as process 222 in the process flow 200 as shown in FIG. 22. The portions of metal seed layer 51 directly under the plated metallic material 54 are left. Throughout the description, metallic material 54 and the underlying remaining portions of metal seed layer 51 are collectively referred to as vias 56 (also referred to a top vias) and conductive pads 58. The resulting structure is shown in FIG. 10. Vias 56 are the portions in dielectric layer 46, while conductive pads 58 are the portions over dielectric layer 46. Each of vias 56 and conductive pads 58 may include a remaining portion of the metal seed layer 51, and a portion of the plated material 54. Conductive bumps 60 are directly over conductive pads 58, and are laterally recessed from the edges of conductive pads 58. Alternatively stated, conductive pads 58 have larger top-view sizes than conductive bumps 60.

Figure 11:
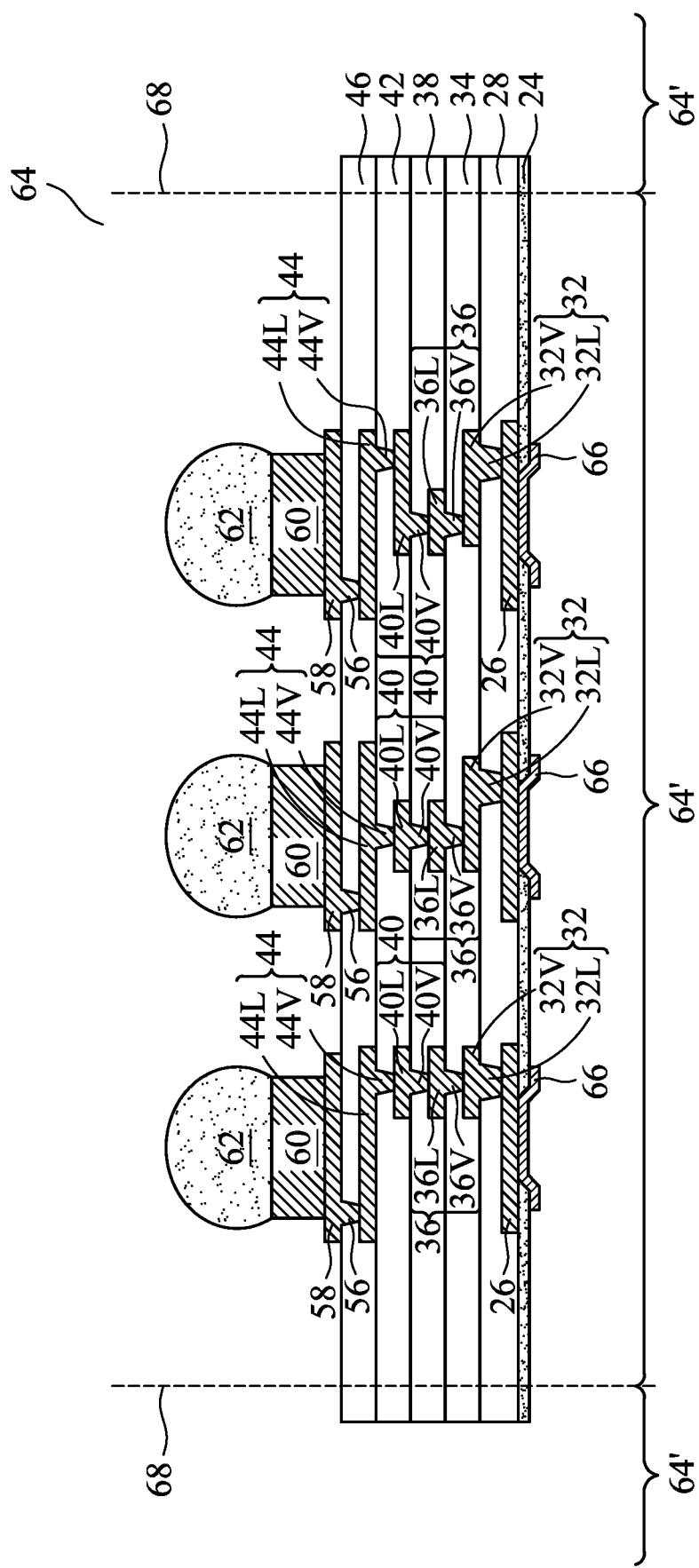

Throughout the description, the structure over release film 22 are referred to as interconnect component 64. In a subsequent process, interconnect component 64 may be placed on a frame (not shown), with solder regions 62 adhered to a tape in the frame. Interconnect component 64 is then de-bonded from carrier 20, for example, by projecting UV light or a laser beam on release film 22, so that release film 22 decomposes under the heat of the UV light or the laser beam. The respective process is illustrated as process 224 in the process flow 200 as shown in FIG. 22. Interconnect component 64 is thus de-bonded from carrier 20. The resulting interconnect component 64 is shown in FIG. 11. In the resulting structure, dielectric layer 24 may be exposed. Solder regions 62, if formed, may be reflowed to have rounded surfaces.

Further referring to FIG. 11, electrical connectors 66 are formed to electrically connect to RDLs 26. In accordance with some embodiments, electrical connectors 66 are UBMs. The formation process of UBMs 66 may also include patterning dielectric layer 24 to form openings, depositing a metal seed layer, which may include a titanium layer and a copper layer on the titanium layer, forming and patterning a plating mask, plating a conductive material, removing the plating mask, and etching the metal seed layer. In accordance with other embodiments, electrical connectors 66 are solder regions, and the formation process may include patterning dielectric layer 24 (for example, through laser drilling) to form openings, placing solder balls into the openings, and performing a reflow process to reflow the solder regions.

In a subsequent process, interconnect component 64 is sawed apart in a singulation process to form a plurality of identical interconnect components 64' (also referred to as package components 64'). The singulation process may be performed by sawing interconnect component 64 along scribe lines 68.

Figure 12:
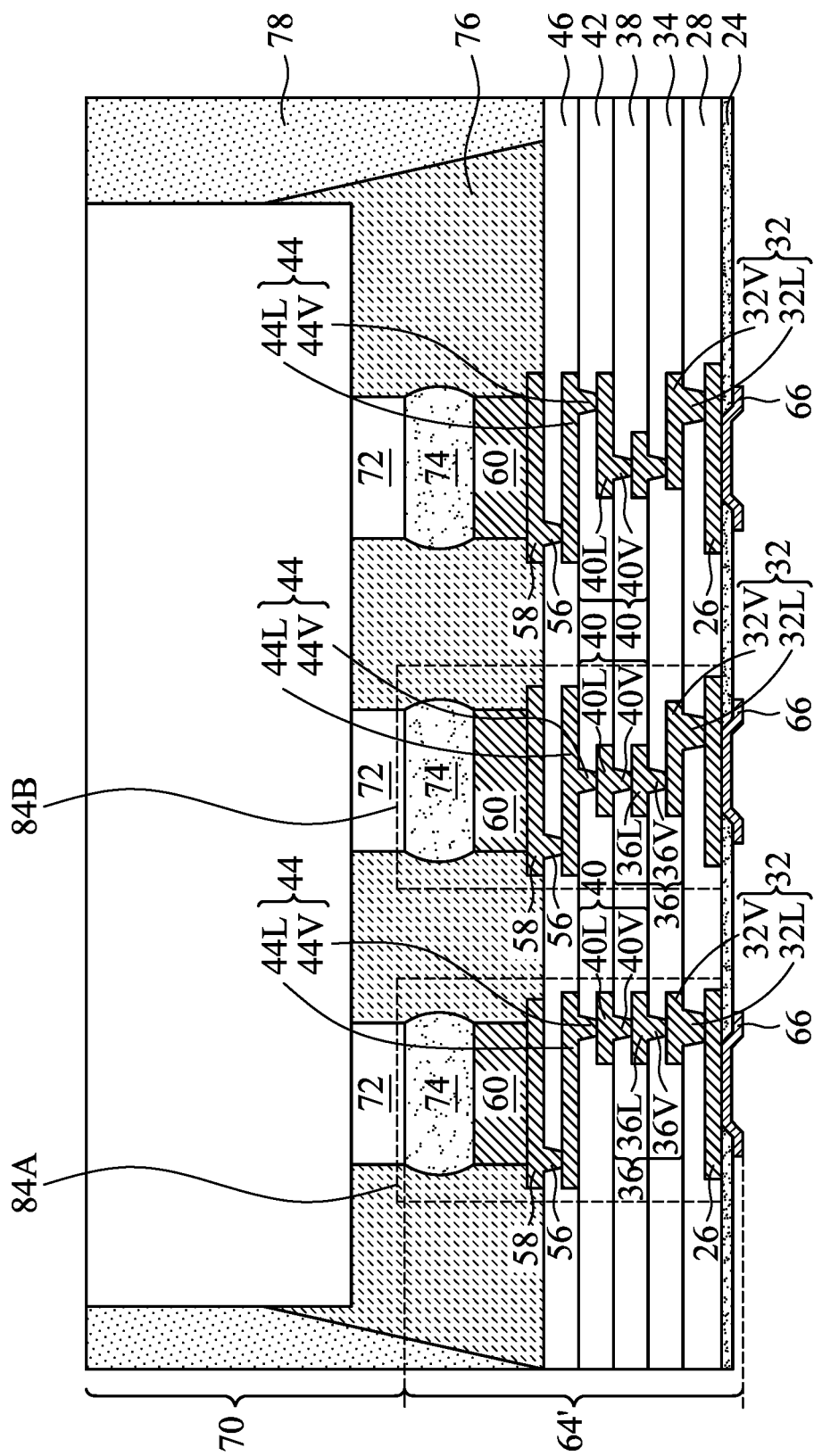

Interconnect components 64' may be used for forming packages. FIG. 12 illustrates a portion of an example structure including interconnect component 64' bonded to a package component 70. Electrical connectors 72, which are on the surface of package component 70, may be bonded to interconnect components 64' through soldered regions 74 in accordance with some embodiments. Solder regions 74 may include solder regions 62 as shown in FIG. 11. Electrical connectors 72 may be UBMs, metal pillars, bond pads, or the like. In accordance with alternative embodiments, electrical connectors 72 are metal pillars, and are bonded to conductive bumps 60 through direct metal-to-metal bonding. In accordance with these embodiments, the solder regions 62 (Figure ii) are not formed, and conductive bumps 60 are physically joined to electrical connectors 72 through direct metal-to-metal bonding. In accordance with some embodiments, underfill 76 is dispensed into the gap between package component 70 and interconnect component 64'. Underfill 76 is in contact with the top surfaces and the sidewalls of the extension portions of conductive pads 58, with the extension portions being extending laterally beyond the edges of the overlying conductive bumps 60. Encapsulant 78, which may be formed of or comprise molding compound, is dispensed. A planarization process may be performed to level the top surface of package component 70 with the top surface of encapsulant 78.

Figure 13:
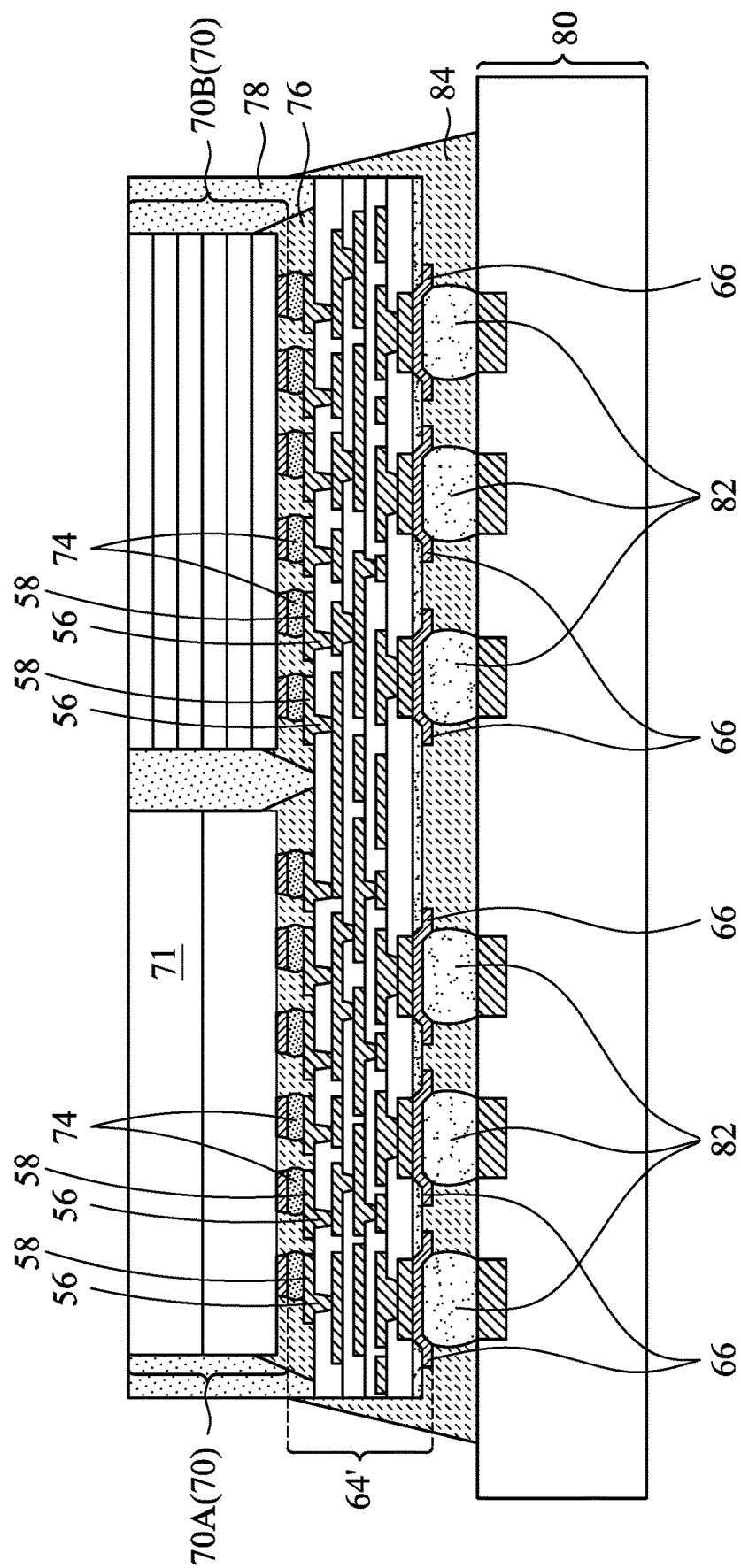
FIG. 13 illustrates a package including eccentric bonding structures in accordance with some embodiments.

FIG. 13 illustrates an application of interconnect components 64'. The structure shown in FIG. 12 may also be a part of the structure shown in FIG. 13. Each interconnect component 64' is bonded to one or a plurality of package components 70 (including 70A and 70B as an example). The details of some of the structures such as the eccentric bonding structures are not shown in detail in FIG. 13, and the details may be found referring to FIGS. 11-12 and FIGS. 14-18. In accordance with some embodiments, package components 70 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Package components 70 may also include memory dies such as Dynamic Random Access Memory (DRAM) dies, Static Random Access Memory (SRAM) dies, or the like. The memory dies may be discrete memory dies, or may be in the form of a die stack that includes a plurality of stacked memory dies. Package components 70 may also include System-on-Chip (SOC) dies.

In accordance with some embodiments, package components 70 include package component 70A, which may be a logic die or an SOC die. In accordance with some embodiments, package component 70A includes semiconductor substrate 71 and integrated circuit devices (not shown, including transistors, for example). Package components 70 may further include package component 70B, which may be a memory die or a memory stack. Underfill 76 and molding compound 78 are also illustrated.

Interconnect component 64' is further bonded to package component 80. In accordance with some embodiments, package component 80 is or comprises an interposer, a package substrate, a printed circuit board, or the like. The bonding may be achieved through solder regions 82. Underfill 84 is dispensed between interconnect component 64' and package component 80.

FIGS. 14 and 15 illustrate a cross-sectional view and a top view, respectively, of a part of an eccentric structure in accordance with some embodiments. The illustrated part is in region 84A in FIG. 12. In accordance with some embodiments, conductive bump 60 has a symmetric structure, which may be rotational symmetric, such as a cylinder. For example, FIG. 15 illustrates that conductive bump 60 may have a round top-view shape. The center (line) 60C of conductive bump 60 is offset from center (line) 58C of conductive pad 58. In accordance with other embodiments, conductive bump 60 may have another symmetric top-view shape selected from the shapes including, and not limited to, hexagonal shapes, octagonal shapes, or the like, which are also symmetric to center line 60C. Via 56 is offset from center line 58C of conductive pad 58, and via 56 and conductive bump 60 offset to opposite directions from center 58C of conductive pad 58. For example, via 56 is shifted toward left in FIGS. 14 and 15, while the center 60C of conductive bump 60 is shifted to toward right. On the other hand, via 44V is offset from via 56. Vias 40V, 36V, and 32V may be vertically aligned to via 44V, or may be offset from via 44V. Throughout the description, the corresponding bonding structure is referred to as an eccentric bonding structure since the center lines of via 56 and conductive bump 60 are misaligned.

Referring to FIG. 15, conductive pad 58 has a length L1 measured in the X-direction. In the Y-direction, conductive pad 58 has a maximum width W1, which may be equal to or smaller than length L1. Conductive pad 58 may be symmetric relative to line 61, which extends in the X-direction and passes through center 58C, and may be asymmetric relative to line 61', which extends in the Y-direction and passes through center 58C. For example, the left part of conductive pad 58 on the left side of center 58C may be smaller than the right part on the right side of center 58C. For example, the shape of conductive pad 58 may be considered as designed starting from a circle 88A (having center 60C as the center of the circle), and cut out the portions outside of secant lines 88B. Secant lines 88B are non-parallel to each other. Thus, conductive pad 58 has a flat top surface, a flat bottom surface, and four sidewalls between the top and bottom surfaces. Two of the sidewalls are arc sidewalls, and the other two sidewalls are straight sidewalls (corresponding to secant lines 88B). The arc sidewalls and the straight sidewalls are alternately arranged. The top view of conductive pad 58 has a water drop shape. The edges of conductive pad 58 may also have some edges (the curved left edge and the curved right edge) that have the curves of round shape 88A. In accordance with alternative embodiments, other shapes having one side wider than the other side may also be adopted. For example, instead of having straight secant lines 88B as the edges of conductive pad 58, curved lines 88C may be used as the edges of conductive pad 58 as an example.

In conventional structures, conductive bump 60 and conductive pad 58 would have been concentric with center line 58C being at the same position as 60C, and via 56 would have been aligned to center line 60C. This, however, results in problems. For example, conductive bump 60, conductive pad 58, and vias 44V, 40V and 36V are formed of metals, which have significantly greater Coefficient of Thermal Expansion (CTE) values than the CTE of surrounding materials such as dielectric layers 46, 42, and 38, underfill 76, etc. When vias 56 and 44V (and possibly vias 40V and 36V) are also aligned to center line 60C, there is a high stress in the resulting structure, which may lead to delamination and trace breaking. If via 44V is moved side-way (while via 56 is still aligned to center line 60C) to be offset from conductive pad 58 in order to reduce the stress, the resulting structure would occupy a larger chip area.

In the embodiments of the present disclosure, via 56 is offset from the center line 58C and offsets in a direction (toward left) opposite to the offset direction (toward right) of conductive bump 60. Accordingly, the stress applied from conductive bump 60 to via 56 is attenuated. Furthermore, via 44V may be offset from via 56 so that the stress coming from conductive bump 60 to via 44V may be further reduced. For example, when temperature increases, and conductive bump 60 applies a downward stress, a part of the stress is attenuated by the conductive pad 58 since via 56 is offset from conductive bump 60. Due to the flexibility of RDL line 44L, the stress is further attenuated before transferring to via 44V.

Referring back to FIG. 14, in accordance with some embodiments, via 56 is offset from the center line 58C of conductive pad 58 by spacing S1. The offset spacing S1 may be equal to or greater than about 8.5 µm, and may be in the range between about 8.5 µm and about 20 µm. Furthermore, it is desirable that via 56 is at least partially overlapped by conductive bump 60. For example, FIG. 14 illustrates that a right portion of via 56 is overlapped by conductive bump 60, while a left portion of via 56 extends beyond the left edge of conductive bump 60. The (at least partial) overlapping of conductive bump 60 is advantageous in allowing via 56 to support both of conductive pad 58 and conductive bump 60, and to receive a part (but not all) of the force passed from conductive bump 60. This also allows RDL line 44L to absorb an adequate amount of the stress.

In accordance with alternative embodiments, as shown in FIG. 15, via 56 may be shifted slightly to the right to the position shown as 55, so that an entirety of via 56 is overlapped by conductive bump 60. For example, the left edge of via 56 may be aligned with (or shift to the right side of) the left edge of conductive bump 60 in accordance with some embodiments. In accordance with alternative embodiments, via 56 is fully offset from conductive bump 60, for example, when via 56 is formed at the position 55' as shown in FIG. 15.

Furthermore, as shown in FIGS. 14 and 15, via 56 is offset from center 60C, and may be offset to the left of, or may be aligned to, center 58C. As may be realized from FIG. 15, increasing the size of conductive pad 58 to be larger than the size of conductive bump 60 allows via 56 to shift for a desirable distance. On the other hand, reducing the size of the left portion of conductive pad 58 may avoid unnecessarily increase in the size of conductive pad 58 where it is not needed.

In accordance with some embodiments, vias 56 and 44V are on the opposite sides of center line 58C, with neither via 56 nor via 44V having any portion passed-through by center line 58C. Offsetting vias 56 and 44 toward opposite directions from center line 58C may result in the increase in the distance between vias 56 and 44V, and the increase in the length of the portion of RDL line 44L interconnecting vias 56 and 44V. This may also increase the ability for RDL line 44L to absorb stress. On the other hand, via 44V may be fully overlapped by conductive bump 60, so that via 44V will not occupy additional chip area (unless it needs to for signal re-routing reasons) since it occupies the same chip area occupied by conductive pad 58 and conductive bump 60.

In accordance with some embodiments, vias 40V, 36V, and/or 32V are vertically aligned to via 44V. In accordance with alternative embodiments, each or all of vias 40V, 36V, and/or 32V may be laterally offset from via 44V, either toward left or toward right.

Referring again to FIG. 15, some dimensions are marked. In accordance with some embodiment, from the top view, the lateral spacing S2 between center line 60C and the edge of via 56 may be in the range between about 4 μm and about 12 μm. The diameter Dia58 of conductive pad 58 may be in the range between about 30 μm and 50 μm. The diameter Dia60 of conductive bump 60 may be in the range between about 20 μm and 40 μm. The spacing S3 between the right edges of conductive bump 60 and conductive pad 58 may be in the range between about 2 μm and about 4 μm.

Figure 16:
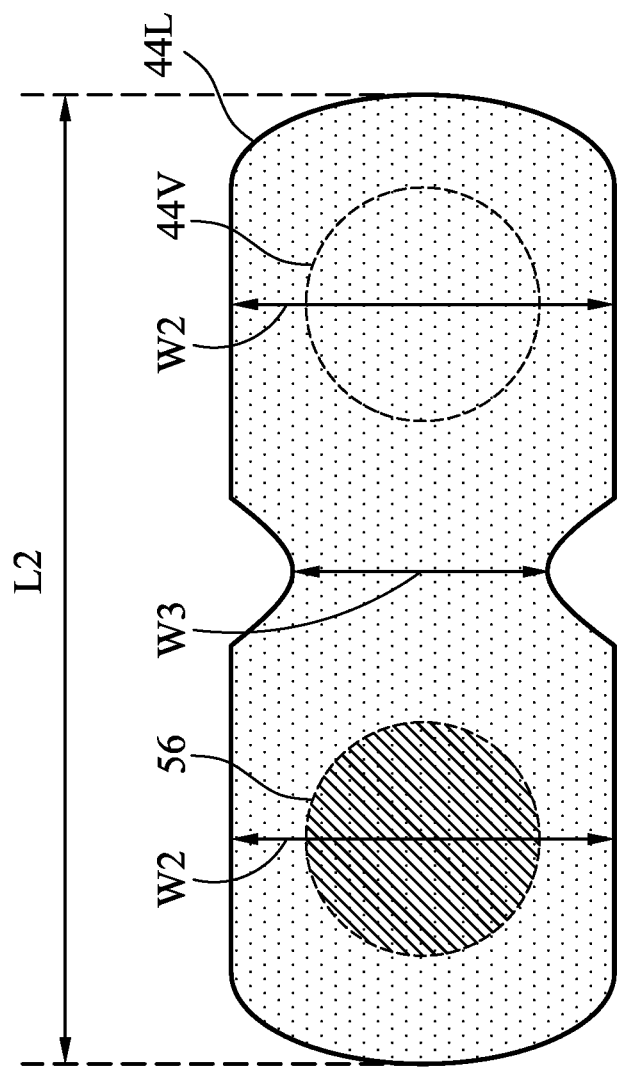
FIG. 16 illustrates a top view of a redistribution line with a narrow middle portion in accordance with some embodiments.

FIG. 16 illustrate a top view of RDL line 44L in accordance with some embodiments. RDL line 44L has length L2, and widths W2 and W3 smaller than length L2. Width W3 is the width of the narrower middle portion of RDL line 44L, and width W3 is smaller than widths W2 of the wider portions on opposite sides of the narrow portion. In accordance with some embodiments, width W3 is smaller than about 0.9 W2, and may be in the range between about 0.6 W2 and about 0.9 W2. The shape of RDL line 44L may be sometimes referred to as a dog-bone shape. Vias 56 and 44V may be aligned to the centers of the left portion and the right portion, respectively, of RDL line 44L. The reduction of width W3 to be smaller than width W2 may improve the flexibility of RDL line 44L, and hence improve its ability for absorbing stress.

Figure 18:
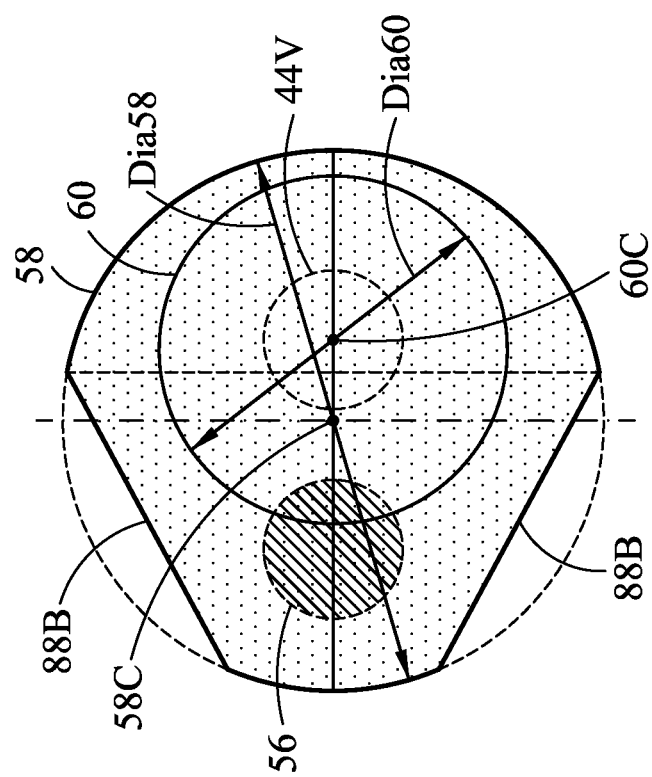
FIG. 18 illustrates a top view of an eccentric bonding structure in accordance with some embodiments.
Figure 17:
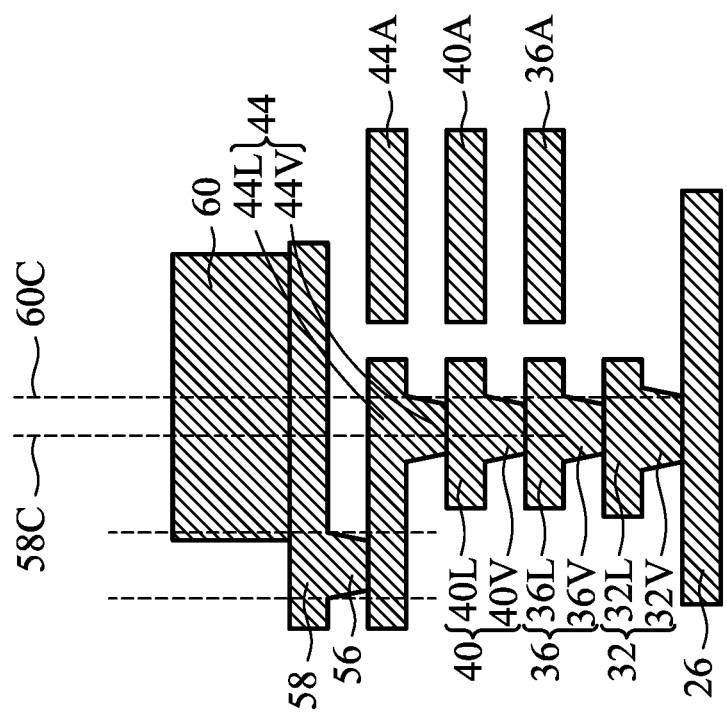
FIG. 17 illustrates a cross-sectional view of an eccentric bonding structure in accordance with some embodiments.

FIGS. 17 and 18 illustrate a cross-sectional view and a top view, respectively, of a part of an eccentric structure in accordance with alternative embodiments. The illustrated part is in region 84B in FIG. 12. These embodiments are similar to the embodiments shown in FIGS. 14 and 15, except that the center line 44VC of via 44V is aligned to center line 60C of conductive bump 60. Each or all of vias 40V, 36V, and 32V may be vertically aligned to, or laterally offset from, via 44V, either toward left or toward right. These embodiments may be adopted when the spacing between vias 56 and 44V is already large enough to provide adequate stress absorption, for example, when the reduction is close to saturation, and the further increase in the spacing does not result in significant reduction in the stress. With via 44V (and vias 40V and 36V) being shifted left compared to the structure as shown in FIG. 14, the right side of chip area may be provided for the routing of other RDLs (such as RDL lines 44A, 40A, and 36A, etc.).

Figure 19:
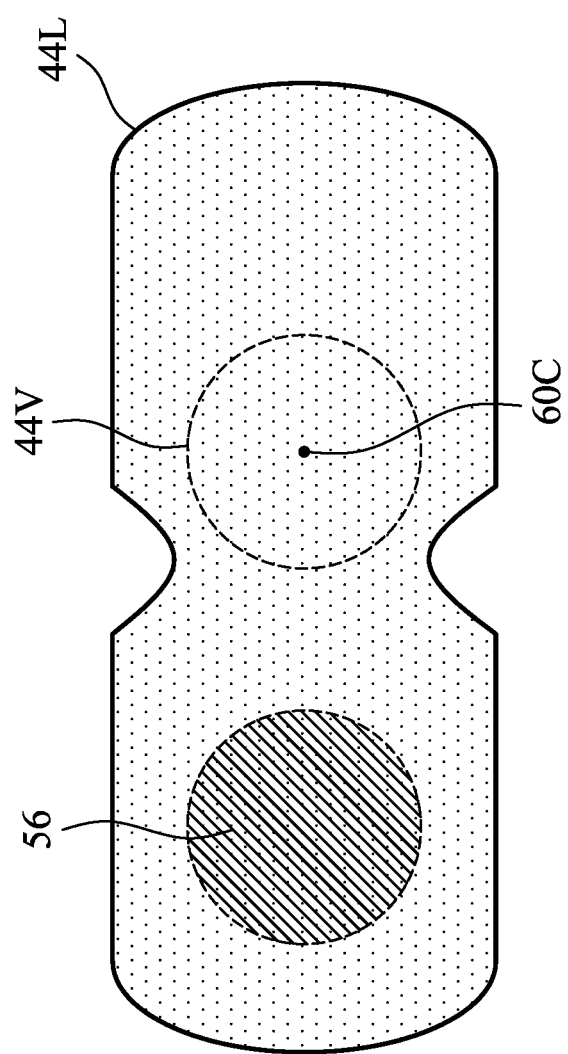
FIG. 19 illustrates a top view of a redistribution line with a narrow middle portion in accordance with some embodiments.

FIG. 19 illustrates the top view of RDL line 44L and vias 56 and 44V corresponding to the structure shown in FIGS. 17 and 18. It is shown that via 44V may be shifted toward left from the center of the right portion of RDL line 44L in order to be aligned to center 60C.

Figure 20:
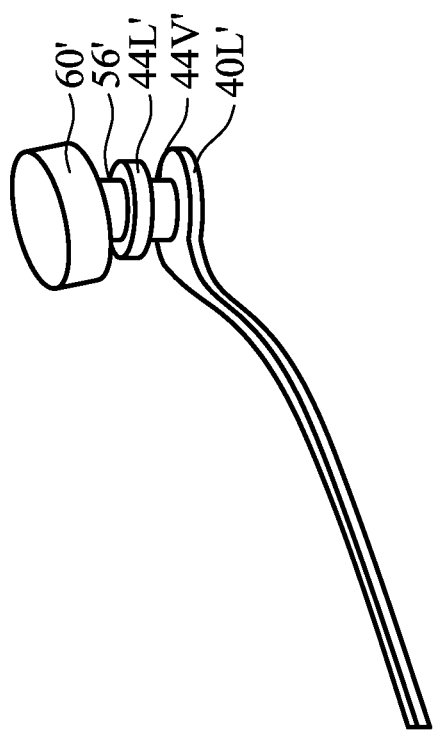

FIGS. 20 and 21 illustrate two structures, on which simulations are performed. The structure shown in FIG. 20 represents a conventional structure, which has conductive bump 60', via 56', RDL pad 44L', and via 44V', which are all vertically aligned. The structure shown in FIG. 21 represents a structure formed in accordance with some embodiments of the present disclosure, which has conductive bump 60, conductive pad 58, via 56, RDL line 44L, and via 44V. Via 56 is offset from the center lines of conductive bump 60 and conductive pad 58. Via 44V is offset from via 56. Conductive pad 58 has one side wider and the other side narrower. The simulation results revealed that when the stress applied to RDL line 40L' (FIG. 20) has a normalized magnitude of 1.0, the stress applied to RDL line 40L (FIG. 21) has a normalized magnitude of 0.87, which means that the embodiments of the present disclosure has the stress reduced by 13 percent compared to conventional structure.

In the example embodiments as provided above, the eccentric bonding structures are formed in a build-up substrate. In accordance with alternative embodiments, the eccentric bonding structures may be formed in an interposer, which may include a semiconductor substrate and through-vias in the semiconductor substrate. For example, when RDLs are formed for the interposer after the backside polishing for revealing through-vias, the eccentric bonding structures may be formed as parts of the RDL structure of the interposer. In accordance with yet alternative embodiments, the eccentric bonding structures may be formed in a Chip-on-Wafer-on-Substrate (CoWoS) package, wherein the eccentric bonding structures may be formed in either or both of the wafer and the package substrate. In accordance with yet alternative embodiments, the eccentric bonding structures may be formed in a fan-out package, wherein the eccentric bonding structures may be formed in the fan-out RDLs, which are formed after the molding of device dies.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming an eccentric conductive pad and a conductive bump, with the conductive pad further having one side narrower and one side wider, and further by forming eccentric vias, the stress in the bonding structure and surrounding features is reduced. The reduction of the stress does not incur the increase in the manufacturing cost, and does not incur chip area penalty.

In accordance with some embodiments of the present disclosure, a method comprises forming a first dielectric layer; forming a first redistribution line comprising a first via extending into the first dielectric layer, and a first trace over the first dielectric layer; forming a second dielectric layer covering the first redistribution line; patterning the second dielectric layer to form a via opening, wherein the first redistribution line is revealed through the via opening; forming a second via in the second dielectric layer, and a conductive pad over and contacting the second via; and forming a conductive bump over the conductive pad, wherein the conductive pad is larger than the conductive bump, with a first center of conductive pad being offsetting from a second center of the conductive bump, and wherein the second via is further offset from the second center of the conductive bump. In an embodiment, the second via and the conductive pad are formed through a common plating process. In an embodiment, the second via, the conductive pad, and the conductive bump are formed using a same metal seed layer. In an embodiment, the method further includes bonding a package component over the conductive bump; and dispensing an underfill, wherein the underfill contacts a first sidewall of the conductive bump, and the underfill further contacts a top surface and a second sidewall of the conductive pad. In an embodiment, the second via comprises a first portion overlapped by the conductive bump, and a second portion extending beyond a corresponding edge of the conductive bump. In an embodiment, the conductive pad comprises a first portion and a second portion on opposing sides of the first center of the conductive pad, and wherein the first portion is narrower than the second portion. In an embodiment, the second via and the second center of the conductive bump are on opposing sides of the first center of the conductive pad. In an embodiment, the first via and the second via are on opposing sides of the first center of the conductive pad.

In accordance with some embodiments of the present disclosure, a structure includes a first dielectric layer; a first via extending into the first dielectric layer; a conductive trace over the first dielectric layer, wherein the conductive trace is over and joined to the first via; a second dielectric layer covering the conductive trace; a second via in the second dielectric layer; a conductive pad over and contacting the second via, wherein the conductive pad has a first center; and a conductive bump over and contacting the conductive pad, wherein the conductive bump has a second center, and wherein the second via and the second center of the conductive bump are on opposing sides of the first center of the conductive pad. In an embodiment, the conductive bump has a round top-view shape, and the conductive pad extends beyond a first edge of the conductive bump in a first direction for a first distance, and beyond a second edge of the conductive bump in a second direction for a second distance smaller than the first distance, wherein the first direction and the second direction are opposite directions going from the second center. In an embodiment, the second via has a first portion overlapped by the conductive bump. In an embodiment, the second via further comprises a second portion extending beyond an edge of the conductive bump. In an embodiment, the first via is aligned to the second center of the conductive bump. In an embodiment, the first via is offset from the second center of the conductive bump. In an embodiment, the conductive trace has a length and widths smaller than the length, and wherein a middle portion of the conductive trace is narrower in width than portions of the conductive trace on opposite sides of the middle portion.

In accordance with some embodiments of the present disclosure, a structure includes a plurality of dielectric layers; a plurality of redistribution lines in the plurality of dielectric layers, wherein each of the plurality of redistribution lines comprises a via and a trace over and contacting the via, and some of the vias in the plurality of redistribution lines are stacked to form a via stack, with the vias being vertically aligned; a top via over and contacting a top trace in a top redistribution line of the plurality of redistribution lines; a conductive pad over and contacting the top via; and a conductive bump over and joined to the conductive pad, wherein the conductive bump and the top via are eccentric, and wherein the conductive pad comprises a first portion extending beyond a first edge of the conductive bump for a first distance; and a second portion extending beyond a second edge of the conductive bump for a second distance smaller than first distance, wherein the first portion is narrower than the second portion. In an embodiment, the first portion comprises two straight edges; and a curved edge between, and connected to, the two straight edges. In an embodiment, the top via and the conductive bump offset toward opposite directions of a center of the conductive pad. In an embodiment, the top via is partially overlapped by the conductive bump. In an embodiment, the structure further includes an underfill contacting first sidewalls of the conductive bump, and second sidewalls and a top surface of the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first dielectric layer;
   forming a first redistribution line comprising a first via extending into the first dielectric layer, and a first trace over the first dielectric layer;
   forming a second dielectric layer covering the first redistribution line;
   patterning the second dielectric layer to form a via opening, wherein the first redistribution line is revealed through the via opening;

forming a second via in the second dielectric layer, and a conductive pad over and contacting the second via; and forming a conductive bump over the conductive pad, wherein the conductive pad is larger than the conductive bump, with a first center of the conductive pad being offset from a second center of the conductive bump, wherein the second via is further offset from the second center of the conductive bump, and the second via comprises a first portion overlapped by the conductive bump, and a second portion extending beyond a corresponding edge of the conductive bump.

2. The method of claim 1, wherein the second via and the conductive pad are formed through a common plating process.

3. The method of claim 1, wherein the second via, the conductive pad, and the conductive bump are formed using a same metal seed layer.

4. The method of claim 1 further comprising:
bonding a package component over the conductive bump; and
dispensing an underfill, wherein the underfill contacts a first sidewall of the conductive bump, and the underfill further contacts a top surface and a second sidewall of the conductive pad.

5. The method of claim 1, wherein the conductive pad comprises a first portion and a second portion on opposing sides of the first center of the conductive pad, and wherein the first portion is narrower than the second portion.

6. The method of claim 5, wherein the second via and the second center of the conductive bump are on opposing sides of the first center of the conductive pad.

7. The method of claim 5, wherein the first via and the second via are on opposing sides of the first center of the conductive pad.

8. A method comprising:
forming a first via extending into a first dielectric layer;
forming a conductive trace over the first dielectric layer, wherein the conductive trace is over and joined to the first via;
forming a second dielectric layer covering the conductive trace;
forming a second via in the second dielectric layer;
forming a conductive pad over and contacting the second via, wherein the conductive pad has a first center, and wherein the conductive pad comprises:
a first curved sidewall and a second curved sidewall, wherein the first curved sidewall is shorter than the second curved sidewall;
a first straight sidewall comprising a first end physically joined to the first curved sidewall, and a second end physically joined to the second curved sidewall; and
a second straight sidewall comprising a third end physically joined to the first curved sidewall, and a fourth end physically joined to the second curved sidewall; and
forming a conductive bump over and contacting the conductive pad, wherein the conductive bump has a second center, and wherein the second via and the second center of the conductive bump offset toward opposing sides of the first center of the conductive pad.

9. The method of claim 8, wherein the conductive bump and the conductive pad are formed using a same seed layer.

10. The method of claim 9, wherein the forming the conductive pad and the conductive bump comprise:
depositing the same seed layer;
forming a first patterned plating mask on the same seed layer, wherein the conductive pad is plated using the first patterned plating mask;
removing the first patterned plating mask;
forming a second patterned plating mask on the same seed layer, wherein the conductive bump is plated using the second patterned plating mask, and wherein the second patterned plating mask covers a portion of the conductive pad; and
removing the second patterned plating mask.

11. The method of claim 8, wherein in a top view of the conductive pad, the first via is closer to the first curved sidewall than to the second curved sidewall, and the first curved sidewall is shorter than the second curved sidewall.

12. The method of claim 8, wherein an entirety of the second via is overlapped by the conductive bump.

13. The method of claim 8, wherein the second via is partially overlapped by the conductive bump.

14. The method of claim 8, wherein the first curved sidewall and the second curved sidewall fit a same circle.

15. The method of claim 14, wherein the first straight sidewall and the second straight sidewall are aligned to secant lines of the circle.

16. A method comprising:
forming a plurality of dielectric layers;
forming a plurality of redistribution lines in the plurality of dielectric layers, wherein each of the plurality of redistribution lines comprises a via and a trace over and contacting the via, and wherein some of the vias in the plurality of redistribution lines are stacked to form a via stack, with the vias being vertically aligned;
in a first plating process, forming:
a top via over and contacting a top trace in a top redistribution line of the plurality of redistribution lines;
a conductive pad over and contacting the top via, wherein the conductive pad comprises:
two straight edges;
a first curved edge physically joined to each of the two straight edges; and
a second curved edge physically joined to each of the two straight edges, wherein the first curved edge and the second curved edge fit a same circle, and the first curved edge is shorter than the second curved edge; and
in a second plating process, forming a conductive bump over and joined to the conductive pad, wherein the conductive bump and the top via are eccentric, and the conductive bump overlaps at least a portion of the top via.

17. The method of claim 16, wherein the second plating process comprises:
forming a plating mask over a metal seed layer, wherein a portion of the plating mask is exposed through an opening in the plating mask; and
plating both of the conductive bump and a solder region in the opening, wherein the solder region is over and contacting the conductive bump.

18. The method of claim 16 further comprising:
bonding a package component to the conductive bump; and
after the package component is bonded, dispensing an underfill contacting first sidewalls of the conductive bump, and second sidewalls and a top surface of the conductive pad.

19. The method of claim 16, wherein the top via comprises a first portion overlapped by the conductive bump, and a second portion extending beyond a corresponding edge of the conductive bump.

20. The method of claim 19, wherein the conductive bump has a circular top-view shape.

* * * * *